US006353800B1

(12) United States Patent
Rector (10) Patent No.: US 6,353,800 B1
(45) Date of Patent: Mar. 5, 2002

(54) METHOD, SYSTEM, SIGNAL AND SOFTWARE FOR SENSING REMOTE BATTERY LIFE BASED UPON CURSOR CHARACTERISTICS

(75) Inventor: Dusty Dale Rector, Southlake, TX (US)

(73) Assignee: Spotware Technologies, Inc., San Diego, CA (US)

( * ) Notice: Subject to any disclaimer, the term of this patent is extended or adjusted under 35 U.S.C. 154(b) by 0 days.

(21) Appl. No.: 09/370,113

(22) Filed: Aug. 6, 1999

(51) Int. Cl.[7] .............................................. G01R 31/40
(52) U.S. Cl. ......................................... 702/63; 345/856
(58) Field of Search ............................. 702/63, 58, 60; 345/856–862; 320/132, 134, 136; 713/300, 310, 320, 340

(56) References Cited

U.S. PATENT DOCUMENTS

5,691,742 A 11/1997 O'Connor et al. .......... 345/116
5,758,172 A 5/1998 Seo ........................ 395/750.01

Primary Examiner—Marc S. Hoff
Assistant Examiner—Edward Raymond (57) ABSTRACT

The present invention describes a method, signal, system, and software for use in a system including a host device and at least one battery powered cursor control device. The status of the battery in the device is estimated by evaluating the periods of inactivity in the cursor and/or the cursor control device and by evaluating the movement of the cursor and/or the cursor control device across a display to determine unusual behavior. Upon unusual behavior determination, the battery's status is then communicated to the user via the host device. The entire method can be implemented without consuming any device battery power except the power consumed during normal device operation.

21 Claims, 4 Drawing Sheets

METHOD, SYSTEM, SIGNAL AND SOFTWARE FOR SENSING REMOTE BATTERY LIFE BASED UPON CURSOR CHARACTERISTICS

FIELD OF THE INVENTION

The present invention relates generally to systems using battery powered devices and more particularly to systems, software, signals, and methods for estimating remaining battery life of battery powered cursor control devices.

BACKGROUND OF THE INVENTION

Having a device unexpectedly malfunction because of a weak battery can be very frustrating, especially when replacement batteries are not available. As anyone who has experienced the unexpected failure of a battery powered device will attest, it would be very helpful to have an advance warning of when a battery is going to fail so that arrangements can be made to have replacement batteries available.

There are currently methods available for measuring the remaining charge on a battery and notifying a user when the battery is low. A simple example of this is the battery light on an automobile's instrument panel. When the car's battery voltage drops below a certain level, a lamp is illuminated notifying the driver that there is a problem. Methods similar to the one just mentioned are sometimes adapted for use in portable battery powered devices such as electric shavers, pagers, etc.

The primary disadvantage of these methods, however, is that to some extent, measuring the battery's remaining charge consumes additional battery power. Specifically, notifying a user of the low battery condition, usually by illuminating a lamp, a light emitting diode (LED), or the like drains even more power from the battery. Add to increased battery drain the fact that these status lamps are often not seen by a user, and it becomes apparent that current methods of measuring the remaining charge on a battery and notifying a user when the battery is low are inadequate. This inadequacy is further evident when dealing with devices using smaller batteries which are incapable of delivering large amounts of power.

Therefore, what is needed is a system, software, signal, and method for estimating remaining battery life and clearly notifying a user of impending battery failure without draining additional power from the battery.

SUMMARY OF THE INVENTION

Accordingly, the present invention provides a method comprising the steps of monitoring movement of a cursor controlled by a cursor control device and indicating a condition effecting the operation of the cursor control device in response to the movement of the cursor meeting at least one predetermined criterion.

The present invention further provides a system comprising at least one processor, memory operably associated with the processor, a program of instructions comprising the steps of: monitoring movement of a cursor controlled by a cursor control device and indicating a condition effecting the operation of the cursor control device in response to the movement of the cursor meeting at least one predetermined criterion.

The present invention also provides a computer readable medium implementing the steps of monitoring movement of a cursor controlled by a cursor control device and indicating a condition effecting the operation of the cursor control device in response to the movement of the cursor meeting at least one predetermined criterion.

The present invention further provides a signal embodied in a propagation medium comprising at least one instruction configured to monitor movement of a cursor controlled by a cursor control device, and at least one instruction configured to indicate a condition effecting the operation of the cursor control device in response to the movement of the cursor meeting at least one predetermined criterion.

It is an object of the present invention to provide a method for estimating the remaining life of a battery used in a battery-powered remote device without consuming power from the remote device's battery.

It is another object of the present invention to provide a method for clearly notifying a user of the impending failure of a battery used in a battery powered remote device without consuming power from the remote device's battery.

One advantage of the present invention is that a remote device's battery is not utilized by the monitoring process.

A further advantage of the present invention is that a remote device's battery is not utilized to notify a user of the battery's power status.

An additional advantage of the present invention is that it provides a clear indication of a battery's power status.

A further advantage of the present invention is that the method can be implemented independent of a specific remote device.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF A PREFERRED EMBODIMENT OF THE INVENTION

In the following detailed description of preferred embodiments, reference is made to the accompanying drawings which form a part hereof, and in which is shown by way of illustration, specific preferred embodiments in which the invention may be practiced. These embodiments are described in sufficient detail to enable those skilled in the art to practice the invention, and it is understood that other embodiments may be utilized and that logical, mechanical and/or electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Figure 1:
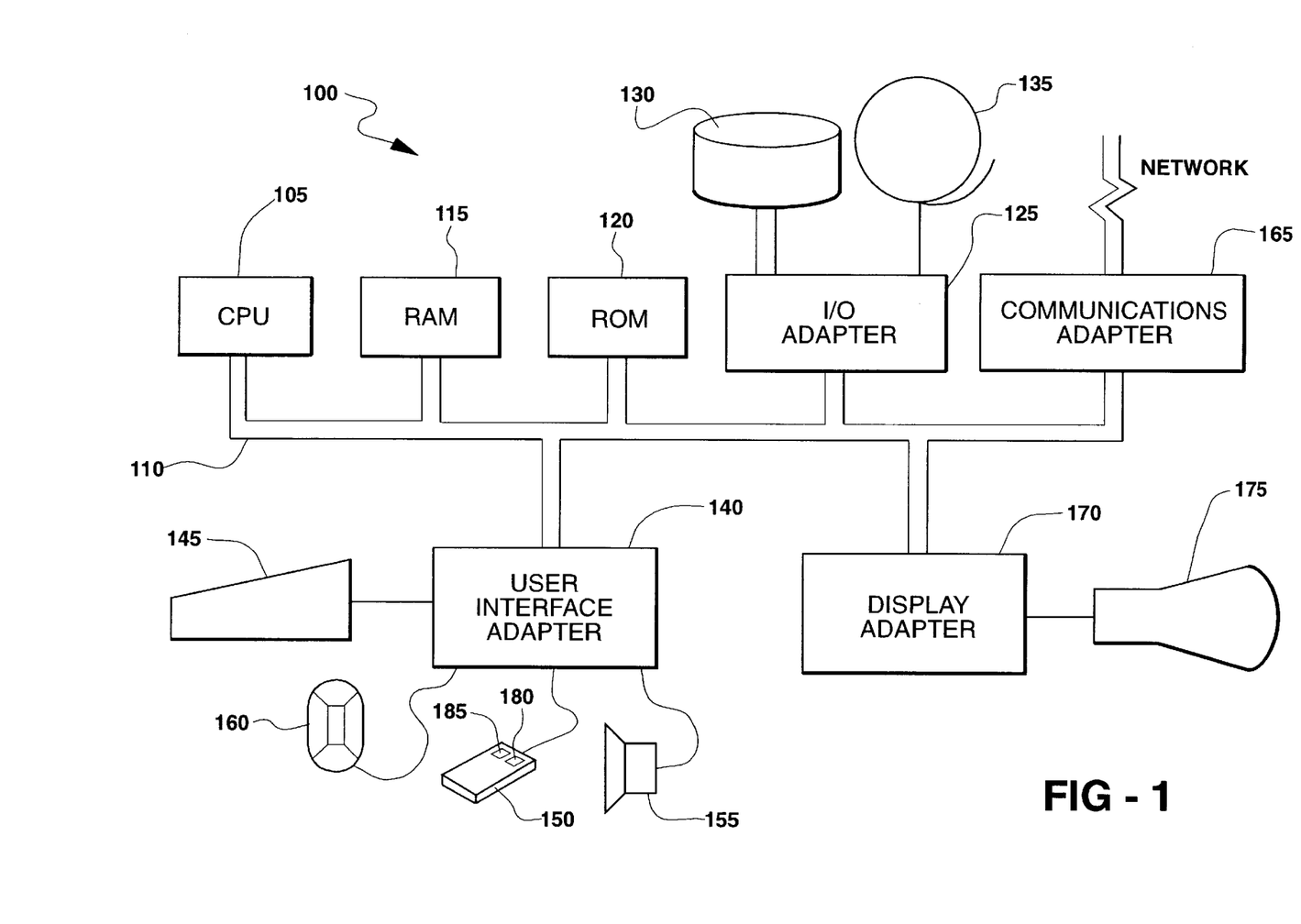
FIG. 1 illustrates a detailed block diagram showing a computer system according to a preferred embodiment of the present invention.

A representative hardware environment for practicing the present invention is depicted in FIG. 1, which illustrates a typical hardware configuration of an information handling system 100 in accordance with the present invention, having a central processing unit (CPU) 105, such as a conventional microprocessor, and a number of other units interconnected via at least one system bus 110. Information handling system 100 may be, for example, a portable or desktop Gateway computer or a Gateway Destination system (Gateway and Destination are trademarks of Gateway, Inc.). Information handling system 100 shown in FIG. 1 includes random access memory (RAM) 115, read-only memory (ROM) 120 wherein the ROM 120 could also be erasable programmable read-only memory (EPROM) or electrically erasable programmable read-only memory (EEPROM), an input/output (I/O) adapter 125 for connecting peripheral devices such as a disk unit 130 and a tape drive 135 to system bus 110, a user interface adapter 140 for connecting a keyboard 145, a mouse 150, a speaker 155, a microphone 160, and/or other user interface devices to system bus 110, a communications adapter 165 for connecting information handling system 100 to an information network such as the Internet, and a display adapter 170 for connecting system bus 110 to a display device such as a monitor 175. The mouse 150 typically has a first button and a second button, 180 and 185 respectively, and is used to control a cursor (not shown) displayed on the monitor 175.

Figure 2:
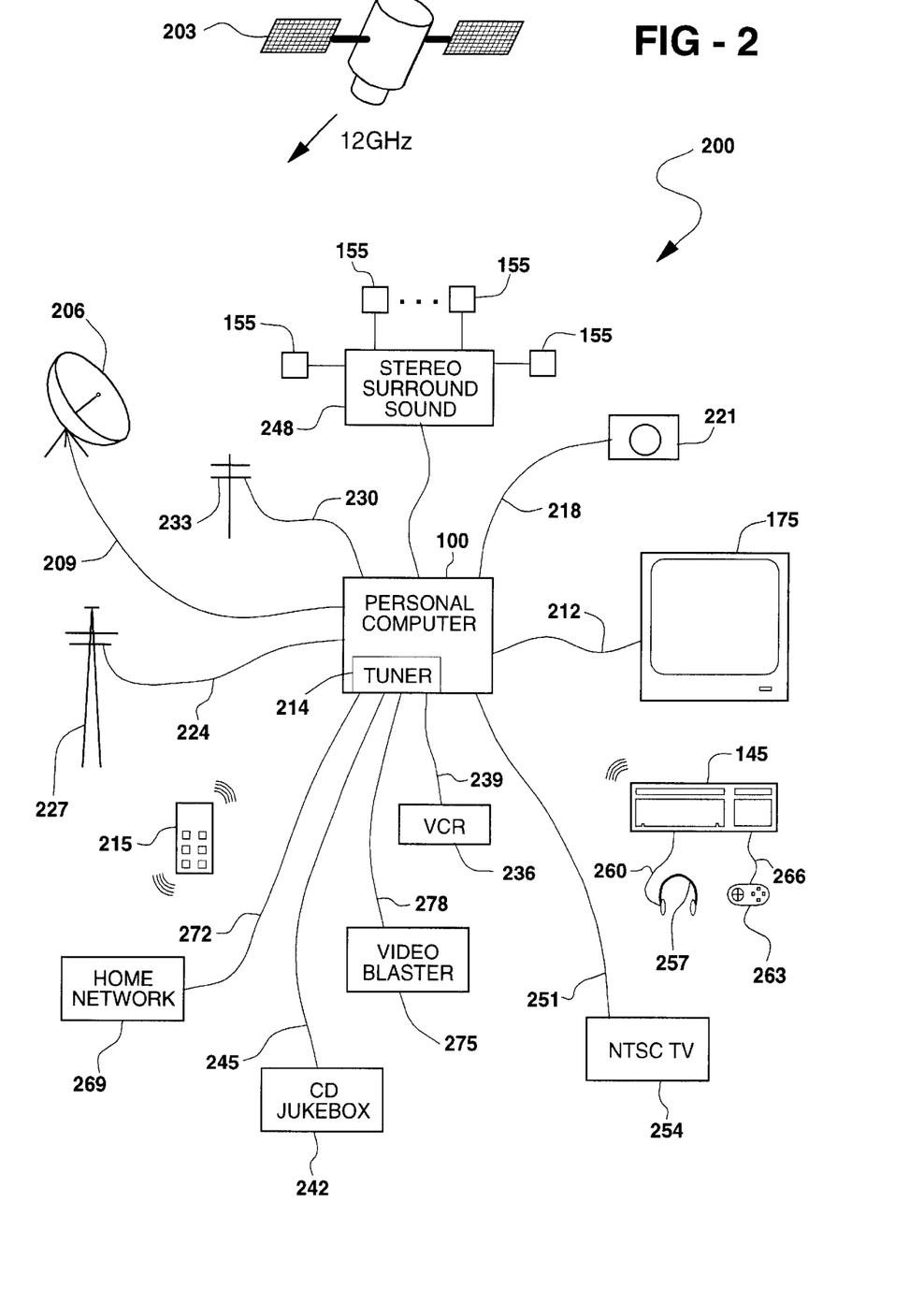
FIG. 2 illustrates a detailed block diagram showing a convergence system according to a preferred embodiment of the present invention.

Referring next to FIG. 2, a system 200 is shown in general detail. Reference numerals or letters in FIG. 2 which are like, similar, or identical to the reference numerals or letters of FIG. 1 indicate like, similar, or identical components or features. External to system 200 is satellite 203 which, in one preferred embodiment, is an HS601 model operated by Hughes at a 101 degree west longitude geosynchronous orbital location. Satellite 203 transmits signals comprising 150 channels of modulated digital video, audio, and data at a frequency of about 12 GHz. The satellite signals are received by system 200 by antenna 206 containing a low noise block converter amplifier. Antenna 206 is preferably about 18 inches in diameter and receives left-hand and right-hand circularly polarized signals between 12.2 and 12.7 GHz. Antenna 206 provides a "down convertedspectrum" signal between 950 and 1450 MHz via a coaxial cable or other suitable communication medium 209 to information handling system 100, such as a personal computer or other system or circuitry capable of processing data. Suitable antennas 206 are already being manufactured and sold by RCA corporation by direct sales and through numerous major retail chains such as Radio Shack.

System 100 contains circuitry and software to further process signals from the antenna, generally demodulating and decoding the signal to produce a VGA (video graphics adapter) signal. The VGA signal is provided via standard VGA compatible monitor cable 212 to drive large screen data quality monitor 175 suitable for viewing in a family room or entertainment room environment. System 100 provides for user input by means of remote controls 215 and 145. Remote control 215 comprises a hand-held size device with standard television controls and a numeric keypad and, in one embodiment, video cassette recorder (VCR) controls and a pointing device. It provides radio frequency (RF) or infrared (IR) control signals received by system 100. Remote control 145 is a full function personal computer keyboard with additional standard television and VCR controls, a pointing device which is preferably in the form of a touchpad, and it also provides RF control signals to system 100. RF control signals were selected over IR or hardwired in one embodiment due to its benefits in a home entertainment environment. Monitor cable 212 is a standard type cable typically used on VGA display devices and comprises up to 15 electrical conductors interfacing with monitor 175 in a D-series shell connector. In one embodiment, full multimedia sourcing and destinationing of audio/video/data (A/V/D) broadcast are provided for. Although the embodiment presented herein discusses the use of VGA signals, it should be mentioned that with an appropriate change in hardware, National Television Standard Committee (NTSC) compliant signals and NTSC compliant hardware will employ the present invention in the manner mentioned herein.

Information handling system 100 may include a tuner 214, tuner circuitry, or card capable of both tuning to multiple channels and receiving television information or signals in the form of the NTSC or Phase Alteration Line (PAL) form from any medium carrying signals from satellite dish 206 which provides digital A/V/D signals from such sources as DirecTV or Primestar (DirecTV and Primestar are trademarks of their respective companies). In another such embodiment, the signals carried on medium 209 provide analog A/V such as NTSC antenna signals. In another such embodiment, the signal carried on medium 218 from camera 221 provides analog A/V such as NTSC audio/video signals. In further embodiments, the signal carried on medium 224 from cable-data source 227 provides analog and/or digital A/V/D. In further such embodiments, the signal carried on medium 230 from Public Switched Telephone Network (PSTN) 233 provides data or phone signals such as integrated services digital network (ISDN) or plain old telephone system (POTS) signals. In one set of such embodiments, system 100 is programmed to automatically record analog signals, such as television programming, onto recordable media, such as a video tape in VCR 236 coupled to cable 239. In another such set of embodiments, system 100 is programmed to automatically record digital signals, such as digital television programming, Digital Versatile Disk (DVD) programming, or compact disk read-only memory (CD-ROM) type audio, onto recordable media, such as recordable compact disks, in CD/DVD jukebox 242 coupled to cable 245. CD/DVD jukebox 242 also plays CDs, CD-ROMs or DVDs for use elsewhere. In another such embodiment, signals are sent to stereo surround system 248 for audio output to one or more speakers 155, and on cable 251 to TV 254. In one such embodiment, earphones 257 on cable 260 and game pad 263 on cable 266 provide additional input/output through remote control 145. Home network 269 is "smart wiring" used to transmit data and control within the home, coupled by cable 272 to system 100. Videoblaster 275 provides video signal processing on cable/connector 278. Cables 224,209,230,218,251,239,278,245, and 260 are examples of communications links that can be wired coupling or wireless, such as RF or IR.

One example of convergence system 200 is the Destination System using the DestiVu user or media interface manufactured and sold by Gateway, Inc. In this manner, convergence system 200 is a fully functional computer integrated with a television, providing TV viewing (via broadcast, cable, satellite, VCR, digital disk, or other broadcast media) and personal computing functionality. This convergence of computer and television enables a user combined access to both television programs and information and computer related functionality such as computer information and programs and Internet access.

Figure 3:
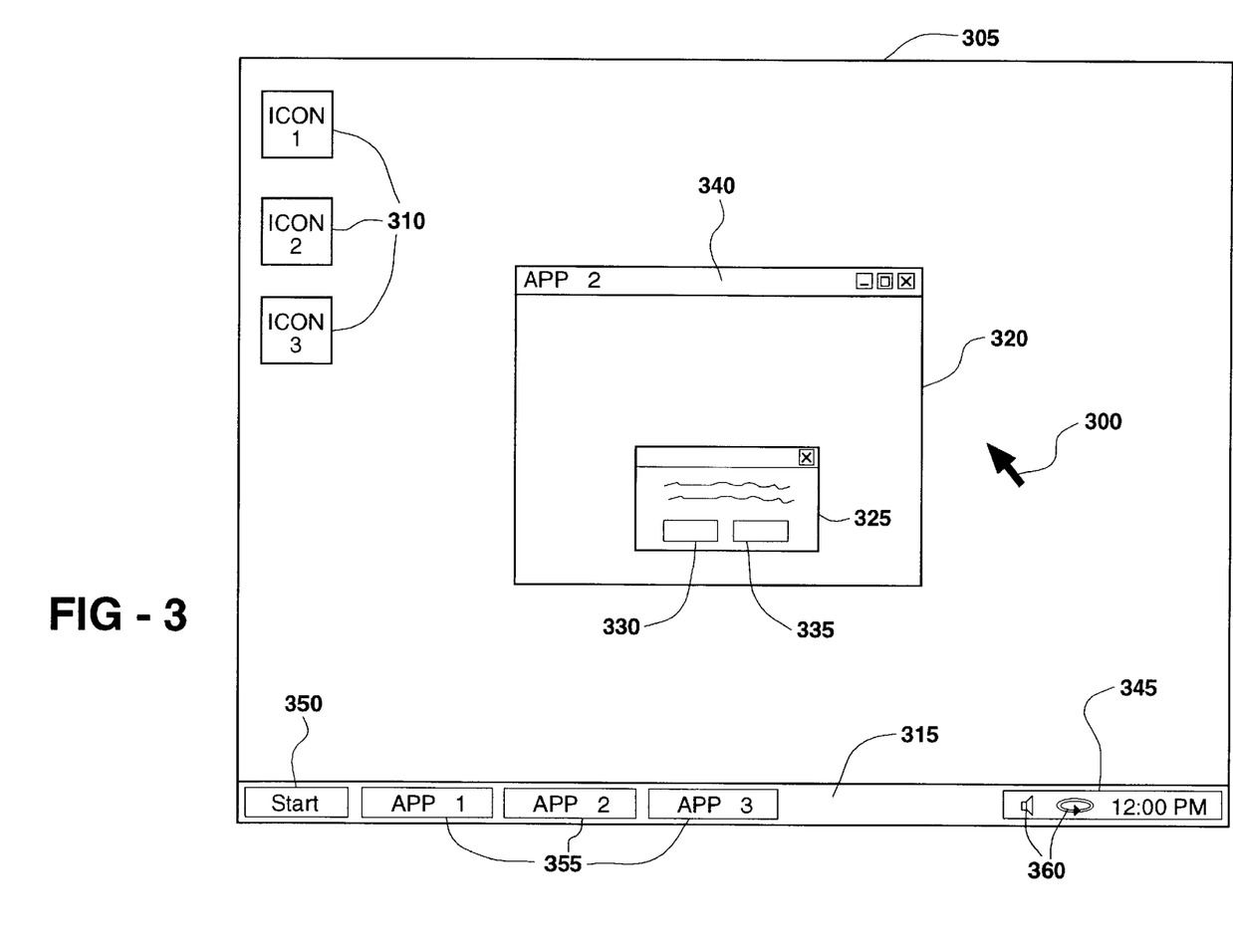
FIG. 3 shows the desktop of a computer operating system's user interface, typically employed on a computer system as in FIGS. 1 and 2, according to a preferred embodiment of the present invention.

Although many of today's televisions employ many of the same hardware resources employed by computers, such as information handling system 100, it is possible that the present invention might be practiced in other electronic devices or networked electronic devices. For example, with the development of audio/video networking, such as the recently proposed HAVi standard, television sets or other audio/video devices, such as audio/video receivers and VCRs, that do not themselves contain such resources could implement the present invention by using the resources of other devices on a network. Referring next to FIG. 3, a detail of an operating system's graphical user interface, or GUI, as is typically displayed on monitor 175 in accordance with the present invention is illustrated. Reference numerals or letters in FIG. 3 which are like, similar, or identical to the reference numerals or letters of FIGS. 1–2 indicate like, similar, or identical components or features. The operating system shown in FIG. 3 is Windows 95 (Windows 95 is a trademark of Microsoft Corporation). However, the present invention will work with DestiVu, OS/2, (DestiVu is a trademark of Gateway, Inc., and OS/2 is a trademark of International Business Machines Corporation), or any other graphical user interface. This GUI includes a cursor 300, a desktop 305, three icons 310, a window 320, a task bar 315, and a dialog box 325, all of which are well known in the art. Task bar 315 further contains a 'Start' button 350, open applications buttons 355, and a system tray 345 which is further comprised of application icons 360, all of which are also well known in the art. Dialog box 325 further contains two buttons, 330 and 335. Programs are represented by the graphical user interface as either icons 310 or as a window 320. The horizontal region along the top of window 320 is called a title bar 340. A program window 320 has the "focus" when it has been designated by the user or by the operating system to receive input from keyboard 145 or mouse 150. In Windows 95, the user gives a window 320 focus by clicking a mouse button, 180 or 185, when cursor 300 is inside that window. Some operating systems, however, give a window the focus whenever cursor 300 is present within that window. The operating system indicates which program has the focus by changing the color of the focused window's title bar 340.

The present invention, in its preferred embodiment, is implemented as a program of instructions, and therefore, the following detailed description assumes this implementation. As is obvious to persons skilled in the art, many different modules and many different sequences of code can be implemented to achieve the functions detailed herein as well as is the possibility of and/or for generating hardware specific coding allowing for the optimization of specific hardware resources. With this in mind, the following detailed description avoids discussing any specific modules or sequences of code and relies only on detailing the functions by which the present invention, in its preferred embodiment, can be practiced.

Now that a hardware and graphical user interface environment is in place, it is necessary to give an overview of the goals and methods of the present invention. The present invention is designed to present a notification to a user when the batteries in a battery powered remote cursor control device are about to run out of power. To accomplish this task, the present invention seeks out unusual behavior by the cursor and/or the cursor control device. Unusual behavior by the cursor and/or the cursor control device includes, but is not limited to, excessively long periods of inactivity, short bursts of activity, and atypical movement characteristics. A notification is presented to the user upon determination that this type of unusual behavior is indicative that the end to of the remote device's battery life is nearing. Within the scope of the present invention, monitoring the X-Y coordinates of cursor 300 on display 175 is equivalent to monitoring the signals generated from the cursor control device, such as mouse 150. As can be appreciated by persons having ordinary skill in the art that any change in the X-Y coordinates of cursor 300 has at least one corresponding movement signal generated by mouse 150. Also appreciable to persons having ordinary skill in the art, and included herein for clarification, is the fact that the programming requirements for monitoring cursor 300 differ from the programming requirements for monitoring mouse 150. However, the end result of each, according to a preferred embodiment of the present invention, is the same. Herein, any implementation reference to either a cursor or a cursor control device such as mouse 150 is to be defined and interpreted as being equivalent and as indicated above.

Figure 4:
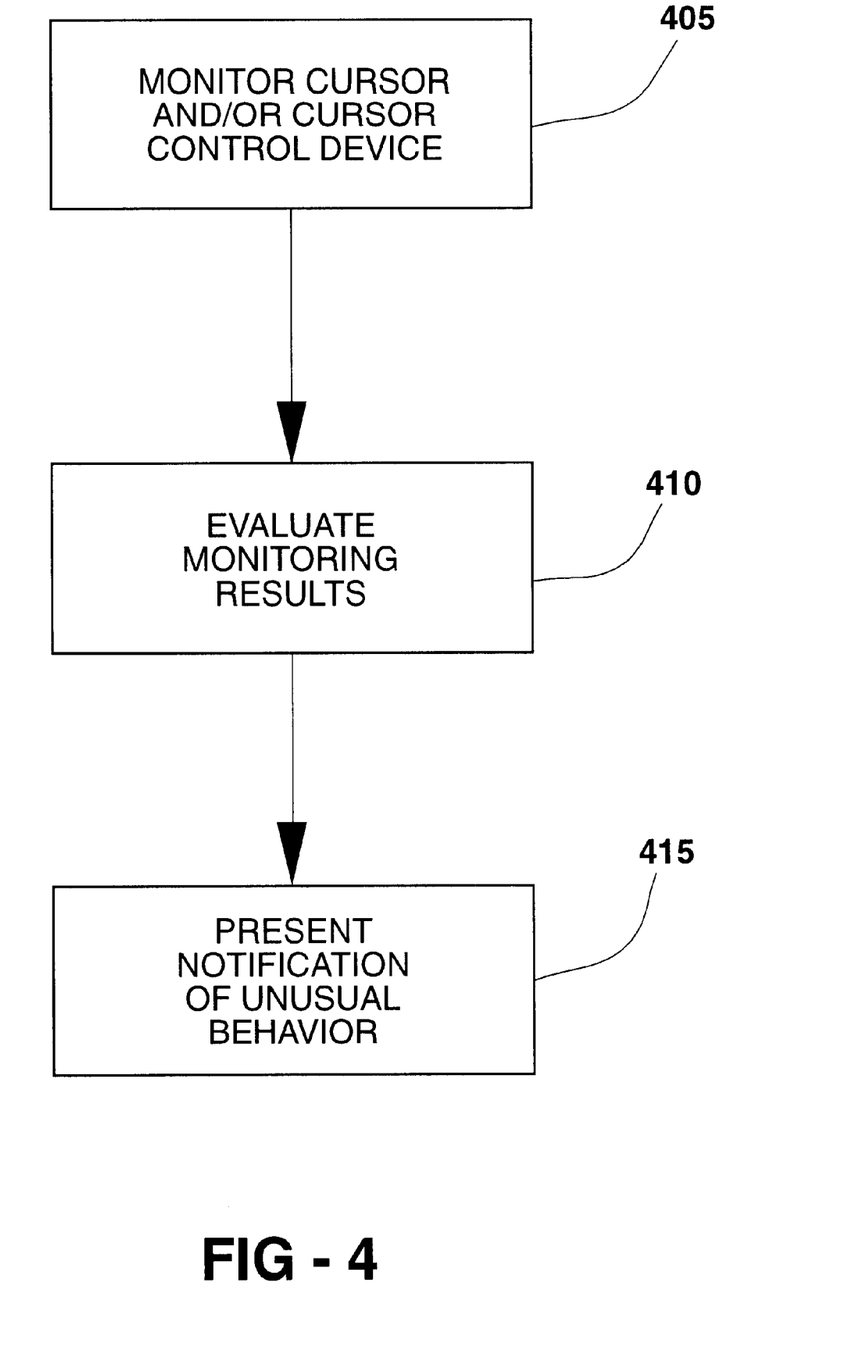
FIG. 4 illustrates a block diagram of the implementation of a preferred embodiment of the present invention.

Referring now to FIG. 4, a block diagram of the implementation of the present invention, according to a preferred embodiment, is shown. Reference numerals or letters in FIG. 4 which are like, similar, or identical to the reference numerals or letters of FIGS. 1–3 indicate like, similar, or identical components or features. Beginning in module 405, monitoring takes multiple forms in the present invention, and its primary goal is to keep track of the activities and/or inactivities of cursor 300. One form of monitoring utilized in the present invention involves keeping track of the time between cursor 300 movements. These periods of inactivity are concerned both with brevity and with excessively long periods. According to a preferred embodiment of the present invention, both excessively long periods of inactivity and atypically brief periods of inactivity/activity (typically difficult for a user to perform on purpose) qualify as unusual. A second form of monitoring utilized by the present invention involves tracking the movements of cursor 300. According to a preferred embodiment of the present invention, unusual cursor 300 movements are movements generally not possible for the user to accomplish on purpose. These unusual movements, detailed in the following paragraphs, include, but are not limited to, jumping, skipping, jittering, and moving in straight lines. Alternate embodiments of the present invention, appreciable to persons skilled in the art, might include monitoring mouse 150 button clicks or a combination of any of the above mentioned monitoring concepts.

In terms of the present invention, an explanation of unusual movement is best handled utilizing a horizontal number line with equally spaced points numbered from one to ten along its length. To begin, normal cursor movement, according to a preferred embodiment of the present invention, involves the cursor being moved from point one to point ten of the number line and appearing at all ten points, as well as points in between the ten points, making a smooth, non-flickering path of travel as it is moved.

In light of the horizontal number line concept, jumping of the cursor according to a preferred embodiment of the present invention is defined and can be illustrated by imagining a user attempting to move the cursor along the horizontal line from point one to point ten. For jumping to have occurred, the cursor would have been seen first at point one and then suddenly at point ten, without appearing at points two through nine. Skipping, according to a preferred embodiment of the present invention, is similar to jumping except that in the above mentioned progression from point one to point ten, skipping would involve the cursor appearing at point one and point ten as well as a fraction of the points in between. For example, a skipping cursor moved from point one to point ten would appear at points one, three, six, eight, and ten, thereby following a non-smooth, flickering path of travel.

Jittering differs from skipping and jumping in that a jittering cursor is seen along the entire path of travel from point one to point ten. The defining characteristic of jittering however, assuming a horizontal path of travel, involves the cursor moving smoothly along its horizontal path of travel and at the same time moving erratically in a vertical direction. That is, as cursor 300 is moved from point one to point ten, it appears randomly both above and below the horizontal one to ten path of travel. Jittering can also take place as erratic movement in a horizontal direction as cursor 300 moves smoothly in a vertical direction.

An additional unusual movement displayed by a cursor in the present invention involves the cursor following a straight line of travel. Since many users' hands move as they utilize a cursor control device and given that most mouse pads are imperfect surfaces and most mice are very sensitive to directional changes, a straight line of travel of any significant length would qualify as an unusual movement according to a preferred embodiment of the present invention. In battery powered cursor control devices experiencing battery failure, it is common for the cursor to "drift" or move on its own in a straight line across display 175. The above referenced movements are unusual according to a preferred embodiment of the present invention, and indicative of a diminishing power supply. However, it is understood that the use of various other "indicative characteristics" of a diminishing power supply can also be used as a basis for implementing the present invention. In other words, it is possible for persons having ordinary skill in the art to recognize other cursor characteristics capable of indicating impending battery failure of a battery powered remote cursor control device, and therefore should be considered to be within the scope of the present invention.

A hesitating cursor is also considered an unusual movement according to a preferred embodiment of the present invention. A hesitating cursor is a cursor which begins to move about the display a significant amount of time after a user issues a movement command utilizing the battery powered remote control cursor device. Many battery powered cursor control device users have experienced a delay between the time they move a mouse 150 and the time they see cursor 300 begin to move about the desktop 305 when the power supply to the cursor control device is low.

As monitoring results are received from module 405, module 410 begins its execution. Module 410 begins by comparing the received monitoring results to a look up table of known cursor activities associated with hardware resources attached to information handling system 100. This table of known cursor activities contains unusual cursor movement characteristics that result from causes other than low battery power. For example, a given information handling system 100 may have a design characteristic that causes an associated cursor 300 to behave in a certain, unusual manner. The table can also contain information that indicates that a monitoring result is in fact indicative of low battery power in the associated battery powered cursor control device. The present invention can be generically designed such that it can be employed and utilized with various hardware resources. In the case of this generic design, access to these various hardware resource's cursor activities can be made available to users via Internet download sites or by other means. Upon determining that a correlation between the monitored cursor activity and the look up table of known cursor activities indicates low power in the associated battery powered cursor control device, and is not a hardware associated unusual movement, module 410 signals module 415. If the results of the look up table do not indicate low power, module 410 continues to monitor 405 and evaluate 410.

In an alternate embodiment of the present invention, module 410 is employed as a filtering predetermination routine. A signal from module 410 can be sent to a filtering module when the results of the look up table of known cursor activities indicate that the unusual movement is caused by something other than low battery power. This filtering module is employed to alter the signals sent by the battery powered cursor control device such that the unusual movement is not seen by the user, if so desired.

Module 410 can also be designed to evaluate the monitoring results by employing any of a number of other techniques. One method of evaluating monitoring results involves passing the results through a filter. This evaluation filter can be designed such that only unusual results, as defined above, are allowed to pass to notification routine module 415. The notification routine module 415 is discussed in the following paragraphs. Should a programmer elect not to employ a filter, evaluation of the monitoring results can also be performed using comparisons. For example, a programmer would first establish time and movement standards for usual or normal activity. Then, as each monitoring result is passed to module 410, a comparison between the programmer established standards and the monitoring results is performed. If any monitoring results fail the standards comparison test, that unusual result is then passed on to notification routine module 415.

Another method of accomplishing the same results as the previously discussed methods involves the utilization of sampling. Should a programmer desire, samples can be taken from the monitoring results received from module 405. These samples can then be evaluated based upon statistical or probabilistic theory for the unusual characteristics detailed in the previous paragraphs. Upon determination of an unusual monitoring results sample, again, the unusual result is passed to notification routine module 415. The above mentioned methods are only a small portion of the many possible evaluation techniques applicable to the present invention obvious to persons skilled in the art.

Upon receipt of any signals or unusual results from module 410, module 415 is then executed. Module 415 is designed to notify the user of the impending battery failure of the remote device. Many different possibilities exist for the user notification such as an audible alarm or an icon 310 that appears on desktop 305 or in window 320. The notification could also take the form of a dialog box 325 in which a message indicating that the battery operated device is losing power and it might be time to replace the batteries, presented on desktop 305 or in window 320. Altering the appearance of cursor 300 by adding a battery or some other image to the cursor's 300 display could also be used to notify the user of the impending battery failure. It is also within the spirit of the invention to combine any of the above referenced notifications to create a composite notification of the impending battery failure. Other methods of notifying the user of the remote device's battery status are appreciable by persons having ordinary skill in the art. Alternate embodiments of the present invention can be utilized to notify the user that the battery powered device is out of range for effective communication as well as other messages.

In summary, the present invention begins by monitoring the cursor and/or the cursor control device attached to an information handling or convergence system utilizing, in a preferred embodiment, a graphical user interface. Monitoring of the cursor and/or the cursor control device includes monitoring for both periods of inactivity and for movement of the cursor and/or the cursor control device. Periods of inactivity are evaluated to determine whether or not they are unusual, i.e., indicative of a diminishing power supply. Unusual, in terms of periods of inactivity, is further explained by examples such as excessively long periods of inactivity, extremely short bursts of activity, etc. With respect to monitoring movement, the present invention attempts to determine if the cursor's and/or the cursor control device's movement is unusual. Unusual movement includes, but is not limited to, jumping, jittering, skipping, and "drifting", or moving in straight lines. Unusual movement can be determined by comparing monitoring results with information available in look up tables of known cursor activities associated with hardware resources attached to a system. Filtering, comparing, or sampling the movement of the cursor and/or the cursor control device as well as by other methods apparent to persons of ordinary skill in the art can also be utilized to determine unusual cursor movement. Upon determination of an unusual movement or an unusual period of inactivity, the present invention presents a notification to the user advising the user of the possibility of impending remote device battery failure. The notification can take the form of an audible alarm, a dialog box, an icon, a change in cursor appearance, a combination of any of the above, or some other form obvious to persons skilled in the art. The whole process consumes no power from the remote device's battery other than that consumed during normal device operation.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

Although the invention has been described with a certain degree of particularity, it should be recognized that elements thereof may be altered by persons skilled in the art without departing from the spirit and scope of the invention. One of the preferred implementations of the invention is as sets of instructions resident in the random access memory 115 of one or more computer or information handling systems configured generally as described in FIGS. 1–4. Until required by the computer system, the set of instructions may be stored in another computer readable memory, for example, in a hard disk drive or in a removable memory such as an optical disk for eventual use in a CD-ROM drive or a floppy disk for eventual use in a floppy disk drive. Further, the set of instructions can be stored in the memory of another computer or encoded or embodied in a signal, such as an analog or digital signal, embodied in a propagation medium and transmitted over the propagation medium by a user. The propagation medium may include a local area network or a wide area network, such as the Internet, or other propagation medium. One skilled in the art would appreciate that the physical storage or encoding of the sets of instructions physically changes the medium upon which it is stored or encoded electrically, magnetically, or chemically so that the medium carries computer readable instructions and other information. The invention is limited only by the following claims and their equivalents.

What is claimed is:

1. A method comprising the steps of:

monitoring movement of a cursor controlled by a cursor control device; and indicating a condition effecting the operation of the cursor control device in response to the movement of the cursor meeting at least one predetermined criterion.

2. The method, as defined in claim 1, wherein the step of monitoring further comprises monitoring for periods of inactivity/activity of the cursor.

3. The method, as defined in claim 1, wherein the at least one predetermined criterion to be met consists of one or more of the following:

no cursor movement for a predetermined period;

jumping cursor movement;

jittering cursor movement;

cursor movement in a straight line; and skipping cursor movement.

4. The method, as defined in claim 1, wherein the cursor control device is a battery powered remote cursor control device.

5. The method, as defined in claim 1, wherein the step of indicating includes notifying a user of the condition.

6. The method, as defined in claim 5, wherein the condition is low battery power.

7. The method, as defined in claim 1, wherein the at least one predetermined criterion is cursor movement associated with specific hardware resources.

8. A system comprising:

at least one processor;

memory operably associated with said processor;

a program of instructions comprising the steps of:

monitoring movement of a cursor controlled by a cursor control device; and indicating a condition effecting the operation of the cursor control device in response to the movement of the cursor meeting at least one predetermined criterion.

9. The system, as defined in claim 8, wherein the step of monitoring further comprises monitoring for periods of inactivity/activity of said cursor.

10. The system, as defined in claim 8, wherein said at least one predetermined criterion to be met consists of one or more of the following:

no cursor movement for a predetermined period;

jumping cursor movement;

jittering cursor movement;

cursor movement in a straight line; and skipping cursor movement.

11. The system, as defined in claim 8, wherein said cursor control device is a battery powered remote cursor control device.

12. The system, as defined in claim 8, wherein the step of indicating includes notifying a user of said condition.

13. The system, as defined in claim 12, wherein said condition is low battery power.

14. The system, as defined in claim 8, wherein said at least one predetermined criterion is cursor movement associated with specific hardware resources.

15. A computer readable medium implementing the steps of:
monitoring movement of a cursor controlled by a cursor control device; and
indicating a condition effecting the operation of the cursor control device in response to the movement of the cursor meeting at least one predetermined criterion.

16. The computer readable medium, as defined in claim 15, wherein the step of monitoring further comprises monitoring for periods of inactivity/activity of the cursor.

17. The computer readable medium, as defined in claim 15, wherein the at least one predetermined criterion to be met consists of one or more of the following:
no cursor movement for a predetermined period;
jumping cursor movement;
jittering cursor movement;
cursor movement in a straight line; and
skipping cursor movement.

18. The computer readable medium, as defined in claim 15, wherein the cursor control device is a battery powered remote cursor control device.

19. The computer readable medium, as defined in claim 15, wherein the step of indicating includes notifying a user of the condition.

20. The computer readable medium, as defined in claim 19, wherein the condition is low battery power.

21. The computer readable medium, as defined in claim 15, wherein the at least one predetermined criterion is cursor movement associated with specific hardware resources.

* * * * *